(12) United States Patent
Kim et al.

(10) Patent No.: US 6,835,996 B2
(45) Date of Patent: Dec. 28, 2004

(54) METHOD AND DEVICE FOR FORMING AN STI TYPE ISOLATION IN A SEMICONDUCTOR DEVICE

(75) Inventors: Chul-Sung Kim, Sungnam-shi (KR);
Si-Young Choi, Sungnam-shi (KR);
Jung-Woo Park, Seoul (KR);
Jong-Ryol Ryu, Yongin-shi (KR);
Byeong-Chan Lee, Yongin-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/684,451

(22) Filed: Oct. 15, 2003

(65) Prior Publication Data

US 2004/0080018 A1 Apr. 29, 2004

Related U.S. Application Data

(62) Division of application No. 10/102,997, filed on Mar. 22, 2002, now Pat. No. 6,660,613.

(30) Foreign Application Priority Data

Aug. 29, 2001 (KR) ........................................ 2001-52396

(51) Int. Cl.[7] .............................................. H01L 29/00
(52) U.S. Cl. ...................... 257/510; 257/510; 257/506
(58) Field of Search ................................ 257/510, 725, 257/93, 374, 501; 438/424, 435, 296

(56) References Cited

U.S. PATENT DOCUMENTS

| | | | |
|---|---|---|---|
| 5,447,884 A | | 9/1995 | Fahey et al. |
| 5,763,315 A | * | 6/1998 | Benedict et al. ............ 438/424 |
| 5,780,346 A | * | 7/1998 | Arghavani et al. .......... 438/296 |
| 5,811,347 A | * | 9/1998 | Gardner et al. ............. 438/435 |
| 5,872,045 A | * | 2/1999 | Lou et al. .................... 438/432 |
| 5,940,717 A | * | 8/1999 | Rengarajan et al. ........ 438/435 |
| 5,985,735 A | * | 11/1999 | Moon et al. ................. 438/435 |
| 6,051,478 A | | 4/2000 | Ibok |
| 6,057,209 A | * | 5/2000 | Gardner et al. ............. 438/427 |
| 6,156,620 A | * | 12/2000 | Puchner et al. ............. 438/400 |
| 6,277,706 B1 | | 8/2001 | Ishikawa |
| 6,323,106 B1 | * | 11/2001 | Huang et al. ............... 438/433 |
| 6,333,232 B1 | * | 12/2001 | Kunikiyo .................... 438/296 |
| 6,391,784 B1 | * | 5/2002 | Ibok ........................... 438/702 |
| 6,468,853 B1 | * | 10/2002 | Balasubramanian et al. ..... 438/221 |
| 6,486,039 B2 | * | 11/2002 | Yoo et al. .................... 438/425 |
| 6,700,159 B2 | * | 3/2004 | Kobayashi ................... 257/332 |

OTHER PUBLICATIONS

Wolf, et al., Silicon Processing for the VLSI Era, vol. 1, Process Technology, Lattice Press, p. 201.
Lo, et al, MOS Characteristics of Fluorinated . . . , IEEE Electron Device Ltrs, 11(11):511–513, (1990).
Wright, et al., Hot–Electron Immunity of SiO2 Dielectrics with Fluorine . . . , IEEE, pp. 347–348, (1989).
Hook, et al., Correlation Between Fixed Positive Charge and Hot–Electron., IEEE, pp. 471–473, (1997).

* cited by examiner

*Primary Examiner*—David Nelms
*Assistant Examiner*—Thinh T Nguyen
(74) *Attorney, Agent, or Firm*—Lee & Sterba, P.C.

(57) ABSTRACT

A trench isolation in a semiconductor device, and a method for fabricating the same, includes: forming a trench having inner sidewalls for device isolation in a silicon substrate; forming an oxide layer on a surface of the silicon substrate that forms the inner sidewalls of the trench; supplying healing elements to the silicon substrate to remove dangling bonds; and filling the trench with a device isolation layer, thereby forming the trench isolation without dangling bonds causing electrical charge traps.

4 Claims, 4 Drawing Sheets

METHOD AND DEVICE FOR FORMING AN STI TYPE ISOLATION IN A SEMICONDUCTOR DEVICE

This application is a DIVISION of application Ser. No. 10/102,997, filed Mar. 22, 2002 now U.S. Pat No. 6,660,613.

BACKGROUND OF THE INVENTION

1. Field of the Invention

The present invention relates to a Shallow Trench Isolation (STI) type semiconductor device and a method for manufacturing an STI type semiconductor device. More particularly, the present invention relates to a method for manufacturing an STI type semiconductor device wherein the interface between a silicon substrate and a device isolation layer has enhanced electrical characteristics so that a leakage current may be reduced.

2. Description of the Related Art

As is well known in the art, a dynamic random access memory (DRAM) having a memory cell comprising a transistor and a capacitor may be downsized to produce a higher degree of integration in the DRAM.

Accordingly, as device dimensions of the memory cell are reduced, the dimensions of active regions and the space therebetween are reduced as well. Also, isolation regions, which play an important role in preventing current leakage between two adjacent devices, become narrow. High integration of the devices may cause several problems. For example, during formation of a field oxide layer, a bird's beak may occur at the edge of the active region allowing current leakage in a gate oxide layer.

A conventional trench isolation structure has been proposed to overcome the above-mentioned problems and is widely used in highly integrated semiconductor memory devices. The conventional trench isolation structure includes a trench region formed in a silicon substrate on which a well region is formed with a depth sufficient for isolating adjacent devices. A trench area is etched using a trench etching mask, which is formed by the patterning of a pad oxide and a silicon nitride which were deposited over the silicon substrate.

The etch process comprises the steps of forming a pad oxide and a nitride layer on a silicon substrate, selectively etching the pad oxide and the nitride layer, and dry etching the silicon substrate by using the patterned pad oxide and nitride layer as an etching mask.

Continuing, the trench area in the silicon substrate on which a well region was formed is anisotropically etched. Usually, the silicon substrate, which was exposed by the anisotropic etching process, has many crystal defects caused by the anisotropic dry etching process. A thermal process, such as annealing, follows to heal these crystal defects. Therefore, a thermal oxide is formed on the silicon substrate, but many crystal defects may still exist between the thermal oxide layer and the silicon substrate. Defects in the silicon substrate move easily so that the morphology of the trench sidewall deteriorates and dislocations occur easily. Additionally, dangling bonds that exist in the crystal defect become trap sites of electrical charges, thereby causing a leakage current during memory cell device operation.

SUMMARY OF THE INVENTION

It is therefore a feature of an embodiment of the present invention to provide an STI type semiconductor device and a method for manufacturing an STI type semiconductor device with enhanced device characteristics, whereby a leakage current during device operation and a charge leak from a capacitor may be reduced.

In accordance with one feature of an embodiment of the present invention, there is provided a method for manufacturing a trench isolation, the method comprising: forming a trench for device isolation on a silicon substrate, wherein the trench has inner sidewalls; forming an oxide layer on a surface of the silicon substrate that forms the inner sidewalls of the trench; supplying healing elements to the silicon substrate to remove dangling bonds; and filling the trench with a device isolation layer, thereby forming the trench isolation without dangling bonds trapping electrical charges.

BRIEF DESCRIPTION OF THE DRAWINGS

The above and other features and advantages of the present invention will become apparent from the following description of the preferred embodiments given in conjunction with the accompanying drawings, in which:

FIGS. 6–7 are cross-sectional views of a semiconductor device having a trench isolation structure in accordance with another embodiment of the present invention, wherein FIGS. 6–7 show manufacturing processes that replace the manufacturing process shown in FIG. 3.

DETAILED DESCRIPTION OF THE INVENTION

This application relies for priority upon Korean Patent Application No. 2001-52396, filed on Aug. 29, 2001, and entitled: "A Method and Device for Forming an STI Type Isolation in a Semiconductor Device" the contents of which are incorporated herein by reference in their entirety.

A method for forming an STI type semiconductor device having a low level of dangling bonds and a low level of defects between an oxide layer and a silicon substrate in a trench region includes: forming a trench area in the silicon substrate, forming an oxide layer on the trench area in the silicon substrate, supplying healing elements to the trench area in the silicon substrate and filling the trench area with a device isolation layer.

The healing elements supplied to the trench area in the silicon substrate are preferably fluorine. The healing elements may be supplied before, after or simultaneously with the step of forming an oxide layer in the trench region. For example, fluorine may be contained in the oxide layer if a thermal process, which forms a thermal oxide layer in the trench region, is carried out in an oxygen and fluorine gas atmosphere. Thereby, fluorine gas is supplied directly through the interface boundary of the thermal oxide layer and the silicon substrate in the trench region.

Healing elements may be supplied after the formation of an oxide layer in a trench region by annealing in a fluorine gas atmosphere. Also, healing elements may be supplied by forming an ion implanting layer such as a polysilicon layer on the oxide layer in the trench region, implanting healing elements in the ion implanting layer through an ion implantation, and diffusing healing elements through the oxide layer to the interface boundary of the silicon substrate of the trench region and the oxide layer.

An STI type semiconductor device exhibiting the features of the present invention comprises a silicon substrate having a trench formed thereon, a filling layer positioned in the trench for device isolation, and a silicon oxide layer containing healing elements positioned between the filling layer and the silicon substrate. The STI type semiconductor device may further comprise a barrier layer positioned between the silicon oxide layer and the filling layer.

In a device according to an embodiment of the present invention, diffused healing elements are preferably contained in the interface boundary, which is an adjacent region between the silicon oxide layer and the silicon substrate. A silicon nitride layer capable of preventing the diffusion of oxygen and other elements may be used to form the barrier layer. A chemical vapor deposition (CVD) silicon oxide layer or a spin on glass (SOG) layer may be used as the filling layer for isolation in the STI type semiconductor device.

Embodiment 1

Figure 1:
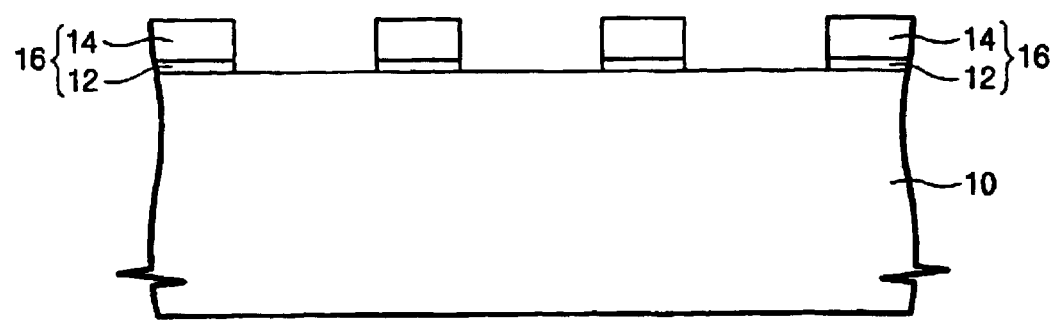
FIGS. 1–5 are cross-sectional views of a semiconductor device showing manufacturing steps for forming a trench isolation in accordance with an embodiment of the present invention.

FIG. 1–FIG. 5 show cross-sectional views of a semiconductor device setting forth stages in a manufacturing process for forming a trench isolation in accordance with an embodiment of the present invention. FIG. 1 shows a trench etching mask (16) which is made of a pad oxide layer (12) and silicon nitride layer (14) on a silicon substrate (10). Specifically, the pad oxide layer (12) is formed on the silicon substrate (10) and the silicon nitride layer (14), which acts as an etching prevention or barrier layer, is deposited by CVD. A photoresist pattern for a trench is formed by a photolithography process. The silicon nitride layer (14) and pad oxide layer (12) are etched through and the photoresist pattern is removed, thereby forming the trench etching mask (16).

Figure 2:
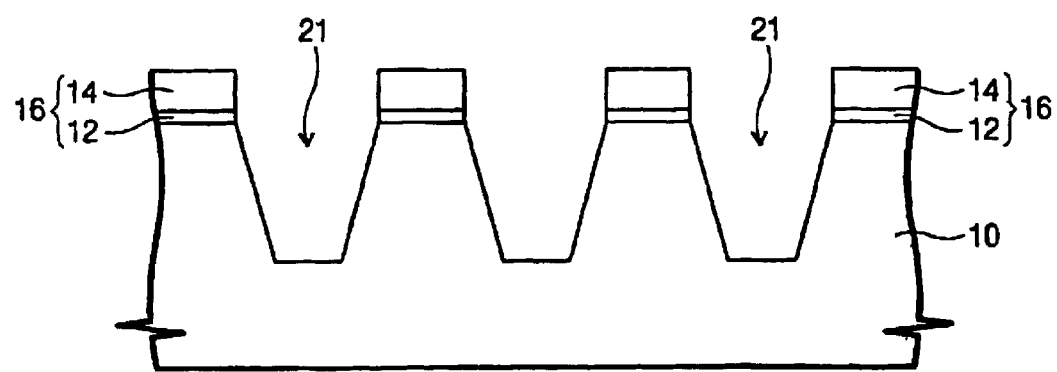

FIG. 2 shows an etching of a silicon substrate (10) using the trench etching mask (16) thereby forming a trench (21) in the silicon substrate. Preferably, etching the silicon substrate is accomplished by an anisotropic etch, and sloped sidewalls are formed inside the trench (21) while etching the silicon substrate.

Figure 3:
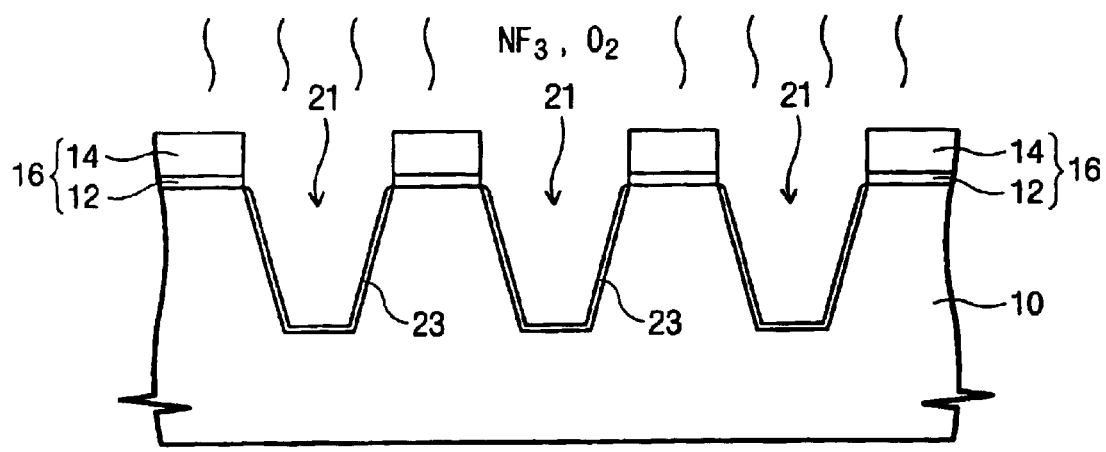

FIG. 3 shows thermally oxidizing the sidewall inside the trench (21) to form a sidewall thermal oxide layer (not shown) inside the trench. A furnace or a rapid thermal process machine at approximately 700° C. may be used to perform this thermal oxidation. Simultaneously, fluorine gas or $NF_3$ containing fluorine is supplied during the thermal oxidation in order to allow the sidewall thermal oxide layer (23) and the silicon substrate inside the trench to contain fluorine therein.

Figure 4:
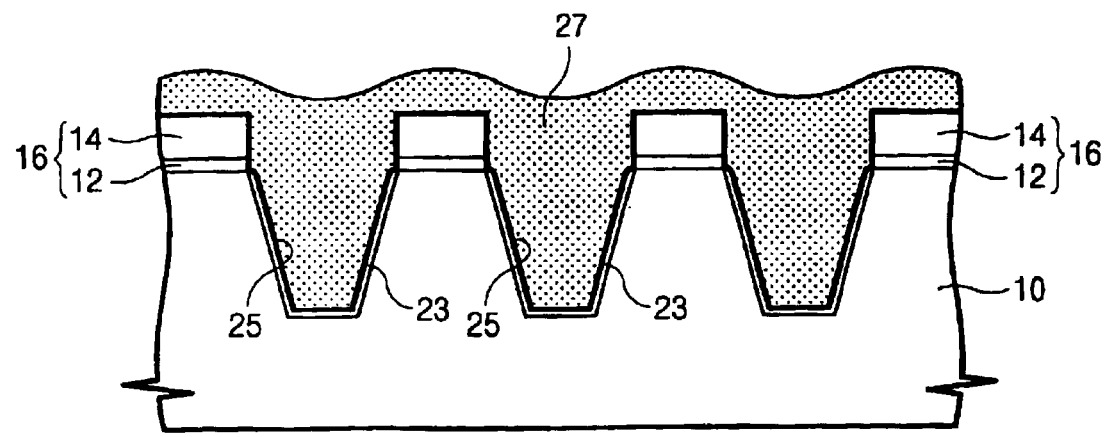

FIG. 4 shows a silicon nitride liner (25) formed on the entire silicon substrate. The silicon nitride liner (25) is preferably deposited by CVD. Generally, the silicon nitride liner is deposited to a thickness of approximately 100 Angstroms. A device isolation layer (27) is formed on the silicon nitride liner (25) to fill the trench. The device isolation layer (27) is preferably a silicon oxide layer, and is preferably deposited by CVD. If an aspect ratio of the gap to be filled is high, a high-density-plasma (HDP) CVD method, which has good step coverage, may be used to deposit the device isolation layer (27). Alternatively, a SOG oxide may be used.

Figure 5:
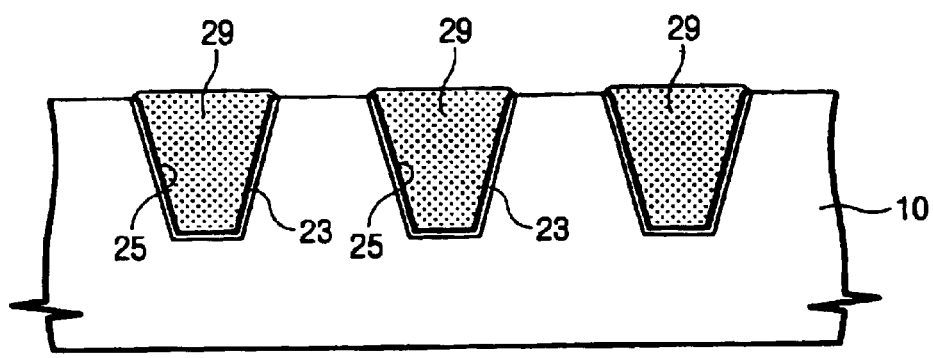

Referring to FIG. 4 and FIG. 5, a chemical mechanical polishing is performed to remove the device isolation layer (27) outside of the trench area and expose the trench etching mask. Silicon nitride layer (14), which forms part of the trench etching mask (16), is removed by a wet etching process; preferably, a phosphoric acid wet etching process. The pad oxide layer (12) is removed to form a trench device isolation layer (29). Preferably, the trench device isolation layer (29) has about a same level of surface height as the substrate (10). It should be noted, however, that formation of the trench is not limited to the method described herein, and the trench may be formed using any other method that is known in the art.

In this embodiment, fluorine gas is supplied to the interface boundary between the trench device isolation layer (29) and the substrate (10) and removes dangling bonds therebetween. Therefore, a charge leak associated with operating a silicon device and an electrical charge leak associated with a storage node, caused by dangling bonds that trap charges, may be prevented.

Embodiment 2

The process of embodiment 2 is similar to that of embodiment 1, with the exception of the method of supplying fluorine gas. Unlike embodiment 1, fluorine gas is not supplied to the interface between the trench device isolation layer (29) and the substrate (10) during thermal oxidation of the trench sidewall. In embodiment 2, the simultaneous processes shown in FIG. 3 of embodiment 1, including both thermal oxidation and supplication of fluorine gas or $NF_3$ containing fluorine, are divided into two steps, as shown in FIG. 6 and FIG. 7.

Figure 6:
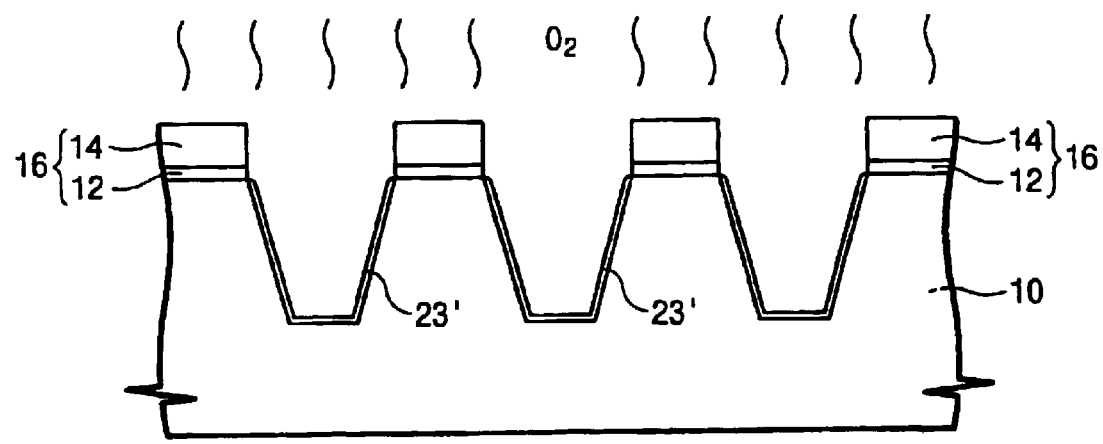

Referring to FIG. 6, the substrate (10) where the trench (21) is formed is thermally oxidized in a furnace to form silicon thermal oxide without fluorine. In other words, a sidewall thermal oxide layer (23') is formed inside the trench (21).

Figure 7:
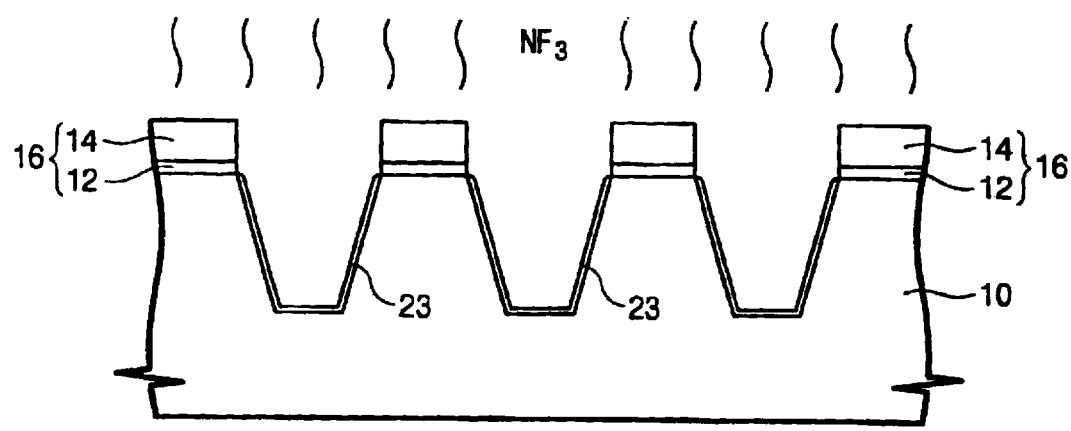

Referring to FIG. 6 and FIG. 7, the sidewall thermal oxide layer (23') on the sidewall inside the trench is annealed in a process which additionally supplies a fluorine containing gas, such as $NF_3$ gas. Fluorine, dissociated from the fluorine containing gas, will diffuse through the sidewall thermal oxide layer (23') and be supplied to the interface boundary between the sidewall thermal oxide layer (23') and the substrate (10). Dangling bonds are thereby reduced or removed and the sidewall thermal oxide layer (23') becomes the sidewall thermal oxide layer (23) containing fluorine by virtue of the diffusion process of fluorine.

The fluorine diffused to the interface boundary between the substrate of a trench and the thermal oxide may remove dangling bonds through two mechanisms. First, fluorine may be bonded to silicon atoms having non-sharing electrons in the interface. Second, fluorine may substitute oxygen from Si—O bonds, and dissociated oxygen ions will form ionic bonds with silicon atoms that have dangling bonds. Removal of the dangling bonds, which are a source of trapped charge in the interface boundary, may ameliorate current leakage problems of silicon devices attributable to the dangling bonds. With regard to device characteristics, removal of the dangling bonds may also prohibit leakage current by inhibiting the penetration of impurities.

Preferred embodiments of the present invention have been disclosed herein and, although specific terms are employed, they are used in a generic and descriptive sense only and not for the purpose of limitation. Accordingly, it will be understood by those of ordinary skill in the art that various changes in form and details may be made without departing from the spirit and scope of the invention as set forth in the following claims.

What is claimed is:

1. A semiconductor device with a trench isolation, comprising:

a silicon substrate having a trench on a surface thereof;

a filling layer positioned in the trench for device isolation; and a silicon oxide layer containing fluorine positioned between the filling layer and the silicon substrate.

2. The semiconductor device with a trench isolation as claimed in claim 1, wherein the fluorine is contained in an interface boundary between the silicon oxide layer and the substrate.

3. The semiconductor device with a trench isolation as claimed in claim 1, further comprising a silicon nitride layer as an oxide barrier layer between the silicon oxide layer and the filling layer.

4. The semiconductor device with a trench isolation as claimed in claim 1, wherein the filling layer comprises a spin-on-glass oxide layer or a CVD silicon oxide layer.

* * * * *